United States Patent [19]

Johnson

[11] 4,061,228

[45] Dec. 6, 1977

[54] SHIPPING CONTAINER FOR SUBSTRATES

[75] Inventor: Douglas M. Johnson, Waconia, Minn.

[73] Assignee: Fluoroware, Inc., Chaska, Minn.

[21] Appl. No.: 752,786

[22] Filed: Dec. 20, 1976

[51] Int. Cl.² .............................................. B65D 85/48
[52] U.S. Cl. .................... 206/454; 206/455;
    206/334; 206/523; 206/526; 206/564; 206/591
[58] Field of Search ............... 206/454, 455, 523, 526,
    206/557, 564, 565, 591, 592, 593, 594, 328, 334;
    229/14 C, DIG. 1; 248/22, 24

[56]            References Cited
          U.S. PATENT DOCUMENTS

| 1,182,916 | 5/1916 | Loomis | 206/593 |
| 2,534,137 | 12/1950 | Lewis | 248/22 |
| 2,572,737 | 10/1951 | Lehner | 206/454 |
| 2,920,884 | 1/1960 | Rowland | 248/22 |
| 2,931,116 | 4/1960 | Boughton | 206/454 |
| 2,984,399 | 5/1961 | Gaulke | 206/454 |
| 3,385,462 | 5/1968 | Deloime | 206/454 |
| 3,607,440 | 9/1971 | Mossford | 206/334 |
| 3,752,384 | 8/1973 | Siburn | 206/593 |

Primary Examiner—Ro E. Hart
Attorney, Agent, or Firm—H. Dale Palmatier

[57] ABSTRACT

A shipping container for brittle substrates including a rigid outer container with a removable cover; a substrate carrier within the outer container and being slotted to carry the substrates on edge; and a substrate retaining cushion between the upper edges of the substrates and the cover of the outer container and including a resilient polyethylene panel with a corrugated shaped bottom to engage, locate and press downwardly upon the upper edges of each substrate and upstanding deformable ribs bearing against the cover and resiliently maintaining downward pressure through the panel on the substrates.

18 Claims, 12 Drawing Figures

SHIPPING CONTAINER FOR SUBSTRATES

This invention relates to containers for confining and shipping rigid substrates, and more particularly, to devices for retaining and cushioning such substrates in shipping containers.

BACKGROUND OF THE INVENTION

Rigid working substrates of glass and other similar silicone materials are used extensively in certain steps in the preparation of printed circuits. Integrated circuit patterns are transposed onto such substrates and then transposed photographically onto silicone wafers for division and application to printed circuit boards. The completion of such printed circuitry always requires a multi-step procedure, and accordingly, the substrates must be handled, and oftentimes shipped from one plant to another, during the processing of the printed circuits.

Because the substrates are rather large in dimension and of small thickness, the likelihood of breakage of such substrates, especially during shipping, is rather high. It should be recognized that substrates of this type used as the structural base for printed circuits are oftentimes square with a width of two to six inches. The thickness of such substrates is oftentimes within the range of 60 to 250 thousandths of an inch.

No devices have been previously known which are satisfactory for the purpose of retaining and cushioning such substrates confined in shipping containers to avoid movement of the substrates in the shipping containers and to avoid the possibility of breakage of the substrates.

Previously, a simple resilient pad has been used between the top edge of the substrate and the lid of the shipping container. Such pads of flexible polyurethane foam confined in a polyethylene bag have proven to be quite unsatisfactory. The pad and the bag have been cut to shreds by the sharp edges of the substrates; the pad is not reusable; the particles from the pad when cut or shredded by the substrates falls down onto the substrates in the shipping container and contaminates these substrates, requiring further cleaning; and the glass substrates have simply not been adequately retained in the shipping container, and it has been found that when one substrate breaks, numerous other adjacent substrates also break by domino effect of one substrate acting upon the next in the container.

SUMMARY OF THE INVENTION

The present invention relates to a shipping container incorporating a resilient substrate clamping device which brings significant pressure to bear on the edges of each of the substrates in a direction parallel to the faces thereof to prvevent movement of the substrates in their planes and also in directions transverse to said planes. The substrate retaining and cushioning device also precisely locates each individual substrate so that the substrates are cumulatively regularly spaced from each other and in locations substantially out of engagement with the divider ribs which are utilized to do the preliminary or rough spacing of the substrates in the shipping container. When the lid of the shipping container is applied, the retaining and cushioning device initially properly locates each of the substrates by engaging the top edge of each of the substrates and moving the substrates by a camming action, into its proper location in the shipping container. Gradually, during closing of the lid of the shipping container, substantial pressure is applied, in the plane of the substrate, and against the top and bottom edges thereof for retaining the substrate in the precisely desired location. A constant pressure is thereafter maintained against the substrates through the medium of a panel of vinyl or polyethylene material so as to spread out the pressure applied over the entire area of the top edges. The substrate retaining and cushioning device has a plurality of small ribs protruding upwardly from the stiff panel and bearing against the top or closure lid of the shipping container which continue all during confinement of the substrates, to apply resilient pressure on the substrates.

The substrate retaining and cushioning device is automatically removed with the cover of the shipping container to immediately facilitate removal of the substrates from the container. The substrate retaining and cushioning device may be readily replaced in the cover of the shipping container so as to be reusable in other shipping containers and to permit substitution of other similar devices which may have different spacings and arrangements for substrates of different dimensions.

DETAILED SPECIFICATION

Figure 1:
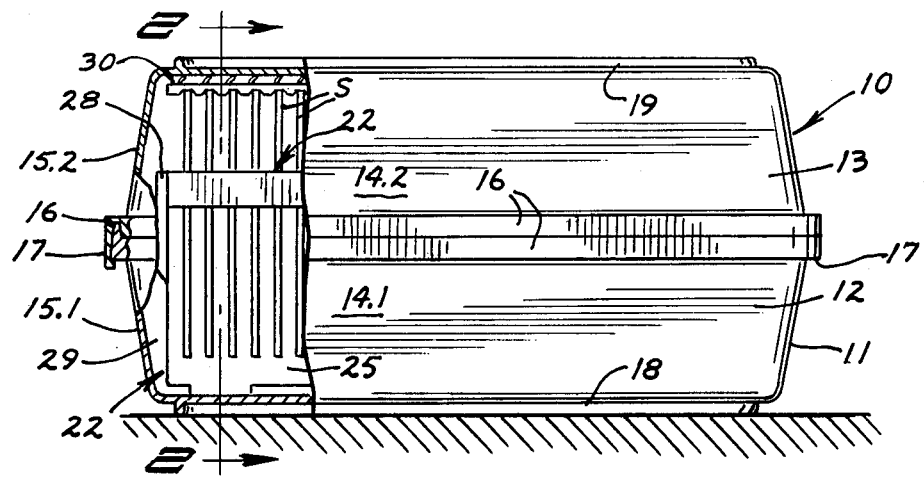
FIG. 1 is a side elevation view of the shipping container with portions thereof broken away for clarity of detail.
Figures 2, 3:
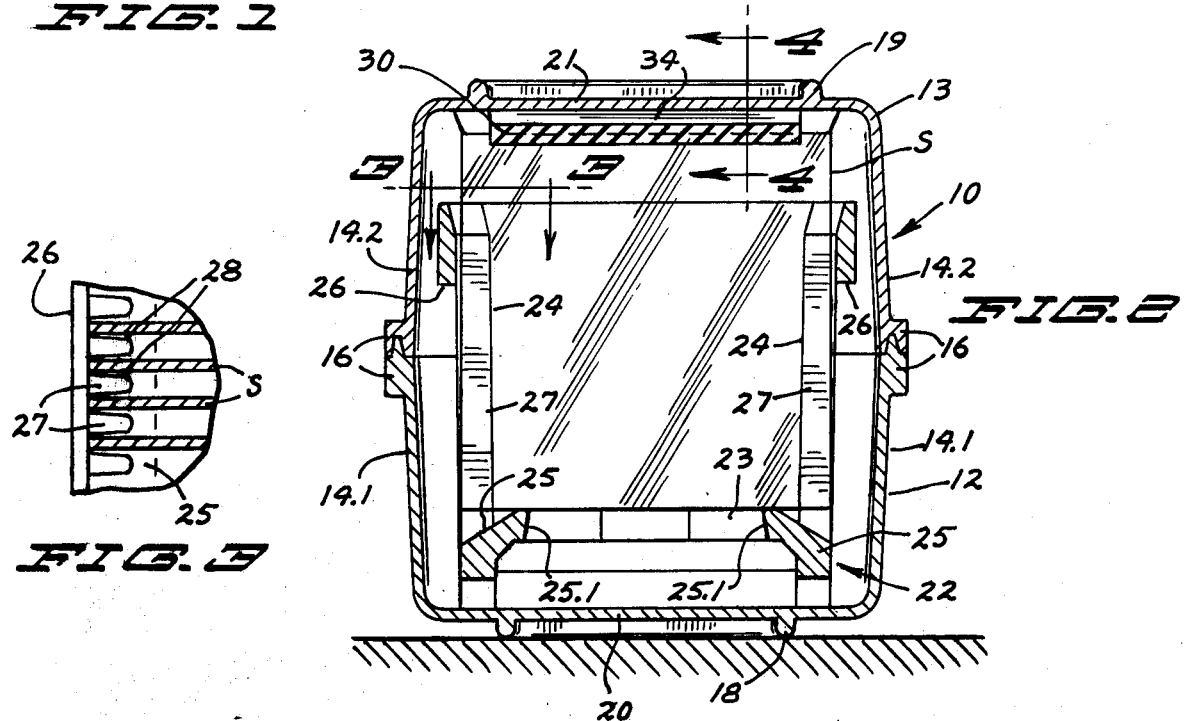
FIG. 2 is an enlarged detail section view taken approximately at 2—2 of FIG. 1.
FIG. 3 is a detail section view taken approximately at 3—3 of FIG. 2.

The shipping container is indicated in general by numeral 10 and includes an elongate and generally rectangular closed box 11 which includes a base or tray 12 and a removable cover 13 which is similar in size and shape to the base 12, but not identical. The side walls 14.1 of the base and 14.2 of the cover, and the end walls 15.1 and 15.2 have interfitting and matching tongue and groove connector portions 16 extending entirely around the periphery of the box, and adjacent the end walls, a flexible latch 17 serves to releasably secure the cover 13 onto the base 12.

The base 12 and cover 13 are both provided with exterior ribs 18 and 19, respectively, each with a generally rectangular shape on the exterior surface thereof for reinforcing the bottom wall 20 of the base and the top wall 21 of the cover against flexing and to also facilitate ready and easy stacking of a number of the shipping containers on top of each other, with the ribs 18 and 19 nesting together to prevent undersired transverse movement between superposed shipping containers.

The base 12 and cover 13 of the box are both molded of impact resistant plastic; and it has been found that high impact styrene is quite acceptable for this purpose.

The shipping container 10 also includes a substrate or wafer carrier or tray 22 to carry a number of substrates or wafers S in spaced and upright position with respect to each other throughout the entire length of the box 11. The carrier 22 is also molded of plastic and it has been found that polypropylene is satisfactory for this purpose. The carrier 22 has panel shaped end walls 23 extending substantially the full height of the carrier 22 and has slotted side walls 24 with continuous rails 25 and 26 interconnecting the lower and upper portions of the end walls 23 together. The rails 25 and 26 are interconnected by a plurality of upright, but spaced apart spacer bars 27, between which open slots 28 receive the side edges of the substrates S. The slots 28 are significantly wider than the thickness of the substrates S to facilitate ready and easy insertion of the substrates into the slots. However, because of this substantial difference between the thickness of the substrates and the width of the slots, the slots 28 and ribs 27 do permit significant transverse movement of the substrates in the slots.

The lower edges of the substrates S are supported on the lower rails 25 of the side walls which have inwardly projecting edge portions 25.1 which extend the full length of the carrier 22 for this purpose. The carrier 22 is readily removable from the shipping container box 11 so that the substrates S may be subjected to further processing while contained in the carrier 22 after the shipping container, carrier, and substrates arrive at their final destination. The carrier 22 is provided with upright flanges 28 projecting slightly endwise from both of the end walls 23. These flanges 28 are guided by and between upright rigid webs 29 on the base or tray 12 of the container so as to prevent movement of the carrier in the shipping container. The carrier 22 may be easily lifted out of the tray 12, but while in the tray, the carrier may not move longitudinally or transversely of the base 12 because of the close interfitting between the end walls 23 of the carrier and the webs or flanges 29 of the base.

The shipping container includes a substrate-retaining cusion 30 in the cover 13 and overlying all of the substrates S carried on edge in the carrier 22. The cushion 30 extends substantially the full length of the cover 13 and of the carrier 22 and is molded of a stiff but flexible resiliently deformable plastic material such as low density polyethylene, and in some cases it may be desirable to form the cushion 30 of low static low density polyethylene.

The cushion 30 comprises an elongate panel 31 substantially as wide as the substrates S so as to engage each of the substrates along the major portion of its upper edge. In some cases it may be desirable that the panel 31 have a width to or slightly in excess of the width of the substrate to minimize the likelihood of breaking of the substrates S which are usually made of glass or other readily frangible material.

At each end of the panel 31, there is provided an elongate recess 32 extending entirely across the width of the panel 31. At each side of the recess 32, the panel 31 is provided with upright stop bars 33. The recess 32 snugly receives downwardly projecting mounting flanges or lips 21.1 formed integrally of the top wall 21 of the cover. The end edge 31.1 of the panel is spaced sufficiently from the end wall 15.2 of the cover to permit access to the end of the panel, facilitating removal of the panel from the cover 13.

The panel 31 has a plurality of elongate upstanding ribs 34 spaced from each other all along the length of the panel. The ribs 34 extend transversely across the entire width of the panel 31. As especially seen in FIG. 6, the ribs 34 stand on one edge, and the upper edge will engage the inner face of the top wall 21 of the box cover 13. The ribs 34 may flex as convergent pressure is applied between the panel 31 and the top wall 21 of the cover, and, accordingly, when the cover 13 is affixed as by latches 17 to the base 12, the ribs 34, if flexed, continue to exert downward pressure at all times.

The panel 31 also has a plurality of elongate depending lugs 35 which extend transversely entirely across the width of the panel 31. The lugs 35 are spaced apart and define a plurality of adjacent substrate-receiving grooves 36. The alternate lugs 35 and grooves 36 give the bottom face of the cushion 30 a corrugated effect. The sides 35.1 of each of the lugs 35 are obliquely oriented and serve as camming faces or surfaces to direct the upper edges of the substrates S into the desired positions as the cushion 30 is lowered onto the substrates with the cover 13. The bottom surface 36.1 at each of the grooves 36 is substantially equal to the width of the adjacent substrate so that when the panel 31 bears downwardly on the upper edges of the substrates, the upper edge of each substrate is captured on the bottom surface 36.1 of the groove and between the oblique faces 35.1 of each adjacent lug so that the substrate will not be able to move transversely. It should be understood that the substrates S may vary considerably in width. In many instances, the substrates have thicknesses in the range of 60 to 90 thousandths of an inch; and the appropriate cushions that are used with these substrates will have the surfaces 36.1 with widths that are substantially equal to the thickness of these substrates. Other substrates may have thicknesses to 250 thousandths of an inch, and, accordingly, the width of the grooves 36 will be increased accordingly, as will be the width of the substrate-engaging surfaces 36.1.

In the form of cushion illustrated in FIGS. 1 – 6, the spacing between adjacent lugs 35 is identical to the spacing between adjacent ribs 34, and each of the lugs 35 is opposite a corresponding rib 34.

Figures 4, 5:
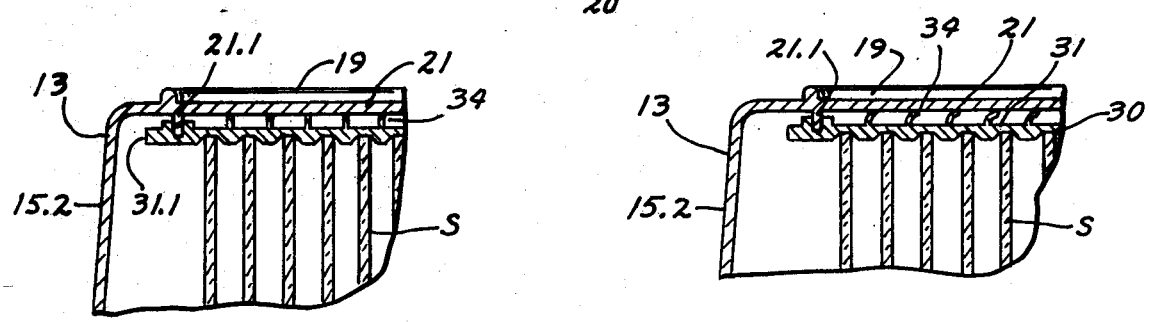
FIG. 4 is a detail section view taken approximately at 4—4 of FIG. 2 and showing the condition immediately prior to final closing of the cover of the shipping container.
FIG. 5 is a view similar to FIG. 4 and showing the relation of parts when the cover is in fully closed position.

In use, the carrier 22 will initially be separate from the box 11 and the substrates S will be loaded into the carrier, one in each of the slots 28. The substrates S project upwardly beyond the upper edge or rim of the carrier so that the substrates may be easily handled by their edges. When the carrier 22 is entirely loaded with substrates, it will be placed in the base 12 of the shipping container box. A substrate-retaining cushion 30 is inserted into the cover 13 of the box and the flange 21.1 is partly received into the adjacent groove 32 of the cushion, substantially as illustrated in FIG. 4. As this time, the top edges of the ribs 34 bear upwardly against the inner face of the top wall 21. The tight fitting relation between the flange 21.1 and the recess 32 of the cushion 30 permits the cover 13 to be manipulated without concern for any likelihood that the cushion will inadvertently fall out. The cover 13 will be moved downwardly over the substrates S in the carrier 22 and as the cushion 30 is seated onto the upper edge of each of the substrates, each of the ribs 34 is flexed, substantially as illustrated in FIG. 5, and simultaneously, the flange 21.1 of the cover extends fully into the recess 32. The flexed resilient ribs 34 urge the panel 30 downwardly firmly against the upper edges of the substrates S, and this downward pressure on the substrates continues so long as the cover remains in place on the base 12 and with the latches 17 in retained position.

The ribs 19 on the top wall 21 prevent significant bowing or flexing of the top wall 21 so that uniform and continuing pressure is applied to all of the substrates in the carrier 22.

Figure 7:
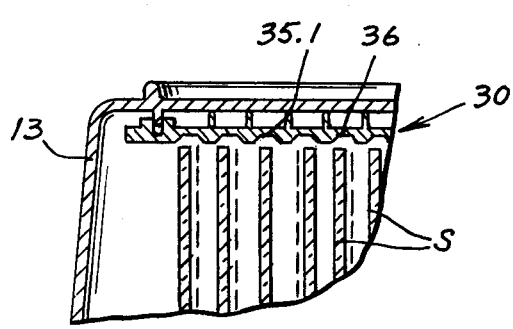
FIG. 7 and FIG. 8 are detail section views, similar to FIGS. 4 and 5, and showing the camming action on the substrates to align them precisely in the desired locations.
Figure 8:
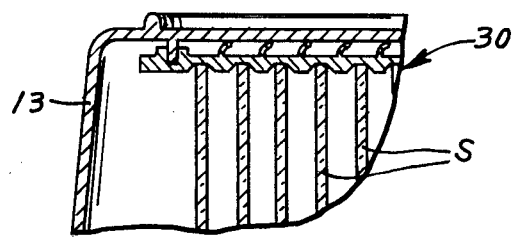

In FIGS. 7 and 8, the function of the oblique camming surfaces 35.1 of each of the lugs is illustrated. It will be recognized in FIG. 7 that the spacing between the several substrates S varies considerably, but each of the substrates is substantially aligned with one of the grooves 36 in the cushion 30. As the cover 13 is moved downwardly so that the cushion engages the substrates S, the upper edges of the substrates engage the camming surfaces 35.1 and are thereby moved transversely so that the spacing between adjacent substrates is rather precisely established, and in this condition, substantially all of the substrates S are moved out of engagement with the adjacent spacer bars 27 in the carrier side walls.

FIG. 8 illustrates the downwardly shifted position of the cover 13 and of the cushion 30 wherein the several substrates are equally spaced from each other.

Figure 6:
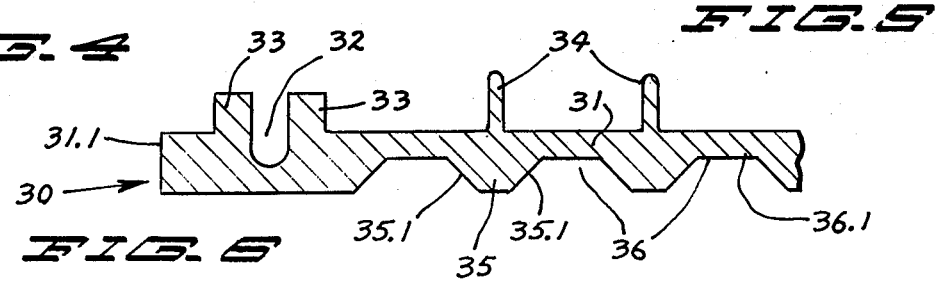
FIG. 6 is an enlarged detail section view of a portion of one of the substrates retaining devices.
Figure 9:
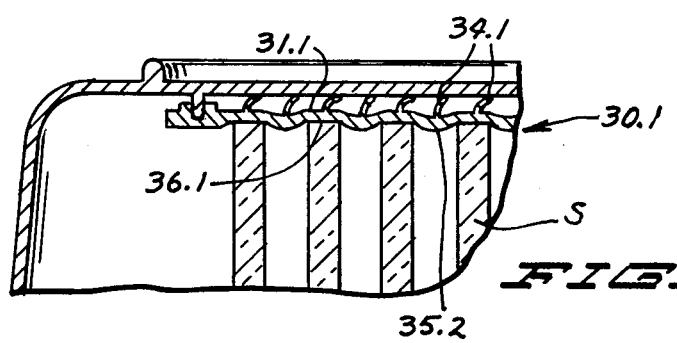
FIG. 9 is an enlarged detail section view similar to FIG. 5 and showing a modified form of the invention.

In the form of cushion 30.1 illustrated in FIG. 9, the depending lugs 35.2 have a smoothly rounded downwardly facing curvature rather than the angular shape of lugs 35 as illustrated in FIG. 6. Also, the grooves between adjacent lugs 35.2 are substantially broader to accommodate the rather thick substrates S. Further, the panel 31.1 has a significantly greater number of upstanding ribs 34.1; and in this particular form, a rib 34.1 is located opposite each of the lugs 35.2 and opposite each of the adjacent grooves 36.1. As a result of the increased number of ribs 34.1, the panel 31.1 is somewhat deformed between each of the substrates S due to the downward pressure by the adjacent rib 34.1.

Figure 10:
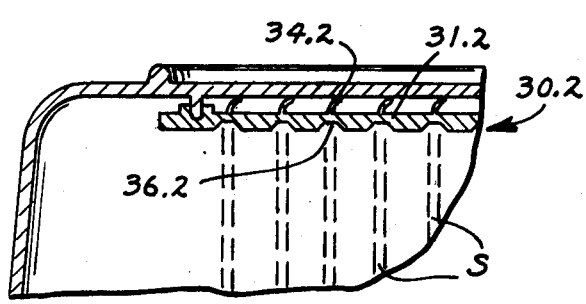
FIG. 10 is a longitudinal section view similar to FIG. 9 and showing a still further modified form of the invention.

In the form of the cushion 30.2 illustrated in FIG. 10, the panel 31.2 has an upstanding rib 34.2 opposite each of the grooves 36.2 so that pressure is brought to bear directly downwardly upon the edges of the substrates S.

Figure 11:
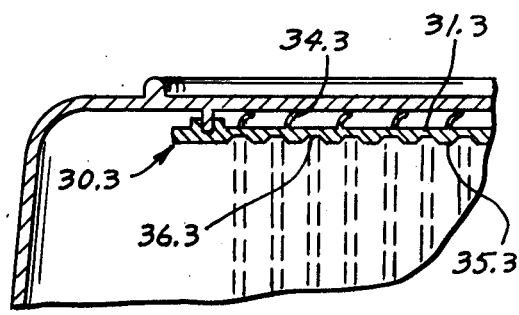
FIG. 11 is an enlarged detail section view similar to FIG. 9 and showing a still further form of the invention.

In FIG. 11, the panel 31.2 has the upstanding ribs 34.3 located rather randomly as relates to the relative positions of the depending lugs 35.3 and grooves 36.3. The ribs 34.3 are regularly spaced from each other, and the grooves 36.3 are also regularly spaced from each other; however, because the spacings between the grooves and the ribs are different, the apparent random relationship results. However, it will be recognized that there is an upstanding rib 34.3 adjacent each of the substrate-receiving grooves 36.3 in this cushion 30.3.

Figure 12:
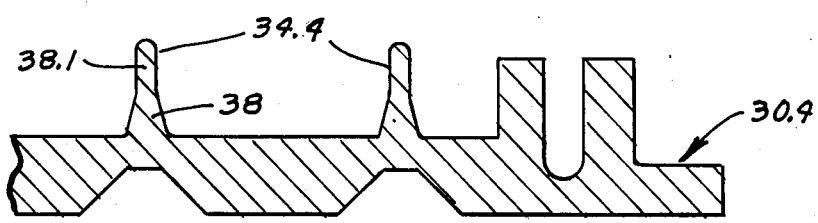
FIG. 12 is an enlarged detail section view similar to FIG. 6 and showing a modified form of the invention.

In the form of the cushion 30.4 illustrated in FIG. 12, the upstanding ribs 34.4 have broadened or thickened base portions 38 and upper portions 38.1 of uniform thickness. These ribs 34.4, because of their broader bases 38, have somewhat less flexibility and exert a more substantial downward force onto the underlying substrates.

It will be seen that the present invention provides a shipping container in which the substrates stand on edge in spaced and face to face relation with each other and wherein the resilient cushion bears downwardly upon the upper edge of each of the substrates and retains the substrates against any transverse movement and holds the substrates out of engagement with the adjacent rigid spacer bars in the carrier in the shipping container. The cushion has upright ribs which engage the top wall of the box and alternate grooves and depending lugs which guide and confine the upper edges of the substrates into stationary position wherein the substrates are precisely located at the desired location. The shipping container may be rough handled without fear of breaking the substrates confined therein.

What is claimed is:

1. A shipping container for substrates comprising:
   an elongate rigid box to extend horizontally and including a removable cover defining the top wall of the box;
   means in the box defining a plurality of upright slots spaced at regular intervals from each other to receive such substrates and hold the substrates in upright position; and
   an elongate substrate-retaining cushion including an elongate stiff panel of resiliently yieldable plastic material and lying along the inside of said top wall to confront the top edges of the substrates, one face of the panel facing upwardly and confronting the top wall of the box and having a plurality of elongate resiliently flexible ribs standing on edge and in edgewise engagement with the adjacent top wall, said ribs being flexed to continually urge the panel away from the top wall, and the lower face of the panel confronting and engaging the upper edges of the substrates and bearing downwardly thereon and having depending and spaced lugs extending between the substrates and preventing transverse movement thereof.

2. The shipping container according to claim 1 and said panel having upwardly opening recesses adjacent the opposite ends thereof, and said top wall having depending projections removably extending into said recesses for retaining the cushion on the top wall.

3. The shipping container according to claim 2 and said projections on the top wall comprising depending ribs extending edgewise into recesses at both ends of the substrate retaining cushion.

4. The shipping container according to claim 1 and the lower face and depending lugs thereon cooperatively defining a corrugated shape having oblique camming surfaces to move the substrates transversely as the cover is lowered onto the box.

5. The shipping container according to claim 1 and said ribs extending transversely of the elongate panel.

6. The shipping container according to claim 5 and the lugs defining elongate grooves therebetween extending transversely of the elongate panel and parallel to the ribs to confine the upper edges of the substrate therein.

7. The shipping container according to claim 6 and said lugs defining oblique camming surfaces at each side of the grooves to guide the substrates into the grooves as the cover moves downwardly toward the substrates.

8. The shipping container according to claim 6 and said panel and ribs and lugs being integrally formed in one piece.

9. The shipping container according to claim 8 and said panel and ribs and lugs being of molded construction and formed of low density polyethylene.

10. The shipping container according to claim 6 and each of the grooves being disposed adjacent one of the ribs.

11. A substrate retaining cushion for use within a closed top shipping container for substrates lying on edge therein, comprising:

an elongate stiff panel of resiliently yieldable plastic material to overlie the edges of such substrates adjacent the top wall of the container, the upper face of the panel having a plurality of elongate resiliently flexible ribs standing on edge to engage and resiliently flex against the top wall of the container, and the panel also having depending means defining a plurality of elongate grooves extending transversely of the elongate panel to receive and confine the upper edges of the substrates against transverse movement.

12. The substrate retaining cushion according to claim 11 and said depending means defining oblique camming surfaces at each side of each of the grooves to engage and guide the substrate into the grooves.

13. The substrate retaining cushion according to claim 11 and said ribs extending transversely of said panel and substantially parallel to said grooves.

14. The invention according to claim 13 and each of the grooves being disposed adjacent one of the ribs.

15. A shipping container for substrates comprising:

an elongate rigid box to extend horizontally and including a removable cover defining the top wall of the box, the box having means defining a fully seated position of said cover;

means in the box defining a plurality of upright slots spaced at regular intervals from each other to receive such substrates and hold the substrates in upright position, said means also defining substrate-supporting rails spaced below and in confronting relation with said top wall to support the substrates with the top edges of the substrates in closely spaced relation relative to said top wall; and an elongate substrate-retaining cushion including an elongate stiff panel of resiliently yieldable polyethylene plastic material and lying along the major portion of the length and breadth of the inside of said top wall to confront the top edges of the substrates, one face of the panel confronting the top wall of the box and having elongate and transversely extending recesses opening upwardly to removably receive depending rib projections on the top wall of the box to retain the panel in close proximity to the top wall, said panel also having a plurality of elongate and resiliently flexible ribs standing on edge and in edgewise engagement with the adjacent top wall, said ribs being flexed to continually urge the panel away from the top wall, and the lower face of the panel confronting and engaging the upper edges of the substrates and bearing resiliently downwardly thereon, the lower face of the panel having a plurality of elongate and depending lugs extending transversely of the panel, said elongate lugs being spaced from each other to define substrate-receiving grooves therebetween, each of said grooves being disposed adjacent a respective rib, and each of said lugs having downwardly and obliquely facing camming surfaces to engage and guide the edges of the substrates into the grooves.

16. The shipping container according to claim 15 and each of said ribs being disposed opposite and in superposed relation to a respective groove.

17. The shipping container according to claim 15 and each of said ribs being disposed opposite and in superposed relation to a respective lug.

18. A substrate-retaining cushion for use within a closed-top shipping container for substrates lying on edge therein, comprising:

an elongate stiff panel of resiliently yieldable polyethylene plastic material to overlie such substrates adjacent the top wall of the container, the upper face of the panel having a plurality of elongate and resiliently flexible ribs extending transversely of the elongate panel and parallel to each other in closely spaced relation, each of said ribs standing on edge and extending substantially the full width of the panel and each of said ribs having an upper edge to engage and flex against the top wall of the container, the panel also having a lower side with a plurality of elongate grooves extending transversely of the elongate panel, the side walls of said grooves being obliquely oriented and the side walls of each groove converging in an upward direction toward a substantially flat downwardly facing surface defining the bottom of the groove, and the panel and ribs being integrally formed in one piece.

* * * * *